(12) United States Patent
Parks et al.

(10) Patent No.: US 8,106,427 B2
(45) Date of Patent: Jan. 31, 2012

(54) IMAGE SENSOR WITH WELL BOUNCE CORRECTION

(75) Inventors: Christopher Parks, Rochester, NY (US); John T. Compton, LeRoy, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 212 days.

(21) Appl. No.: 12/642,902

(22) Filed: Dec. 21, 2009

(65) Prior Publication Data

US 2011/0147875 A1 Jun. 23, 2011

(51) Int. Cl.
*H01L 27/148* (2006.01)
*H01L 21/00* (2006.01)

(52) U.S. Cl. .......................... 257/228; 438/57

(58) Field of Classification Search .......... 257/222, 257/225, 228, 258, E27.076, E27.098; 438/57, 438/78
See application file for complete search history.

(56) References Cited

U.S. PATENT DOCUMENTS

| | | |
|---|---|---|
| 6,271,554 B1 | 8/2001 | Nozaki et al. |
| 7,016,089 B2 | 3/2006 | Yoneda et al. |
| 7,456,880 B2 | 11/2008 | Okita et al. |
| 7,468,750 B2 | 12/2008 | Mabushi et al. |
| 7,485,903 B2 | 2/2009 | Abe et al. |
| 2001/0012133 A1 | 8/2001 | Yoneda et al. |
| 2002/0020845 A1 | 2/2002 | Ogura et al. |
| 2006/0044434 A1 | 3/2006 | Okita et al. |
| 2007/0024931 A1 | 2/2007 | Compton et al. |

FOREIGN PATENT DOCUMENTS

EP 1808894 7/2007

OTHER PUBLICATIONS

PCT International Search Report for Application No. PCT/US2010/060393 dated Feb. 15, 2011, 5 pages.

*Primary Examiner* — Calvin Lee
(74) *Attorney, Agent, or Firm* — Blakely, Sokoloff, Taylor & Zafman

(57) ABSTRACT

An image sensor includes a pixel array having photoactive pixels and dark reference pixels. The photoactive pixels can be configured in a sub-array within the pixel array. Well contacts are only placed along opposing sides or edges of the sub-array of photoactive pixels or along opposing sides or edges of the pixel array.

8 Claims, 7 Drawing Sheets

IMAGE SENSOR WITH WELL BOUNCE CORRECTION

TECHNICAL FIELD

The present invention relates generally to electronic image sensors for use in digital cameras and other types of imaging devices, and more particularly to voltage reference stability in an electronic image sensor pixel array.

BACKGROUND

A typical electronic image sensor comprises a number of light sensitive picture elements ("pixels") arranged in a two-dimensional array. Such an image sensor may be configured to produce a color image by forming an appropriate color filter array (CFA) over the pixels. Examples of image sensors of this type are disclosed in United States Patent Application Publication 2007/0024931, entitled "Image Sensor with Improved Light Sensitivity," which is incorporated by reference herein.

As is well known, an image sensor may be implemented using complementary metal-oxide-semiconductor (CMOS) circuitry. In such an arrangement, each pixel typically comprises a photodiode and a number of transistors. The pixel transistors may be p-type MOS (PMOS) transistors, in which case the photodiode and the transistors are generally formed in an n-well region on a p-type substrate. Alternatively, the pixel transistors may be n-type MOS (NMOS) transistors, in which case the photodiode and the transistors are generally formed in a p-well region on an n-type substrate.

"Well bounce" is a problem that arises in CMOS image sensors having pixels formed in n-well or p-well regions of the type described above. Well bounce is an undesirable variation in well voltage that is typically due to the well bias voltage being introduced through well contacts in a ring around the periphery of the pixel array. These well contacts are close to edge pixels of the array but far from central pixels of the array. As a result, the resistance of the well from the edge of the array to its center can be very large, causing well bounce to occur in conjunction with switching operations associated with pixel sampling and readout.

A number of techniques have been developed in an attempt to alleviate the well bounce problem. One such technique involves increasing well conductivity, as described in, for example, U.S. Pat. No. 6,271,554, entitled "Solid-State Image Sensor Having a Substrate with an Impurity Concentration Gradient." However, an approach of this type requires process changes, which can increase manufacturing cost and complexity, and in any event may not provide a sufficient reduction in well bounce.

Another technique involves the addition of well contacts within the pixel array, as described in, for example, U.S. Pat. No. 7,016,089, entitled "Amplification-Type Solid State Imaging Device with Reduced Shading" or U.S. Pat. No. 7,485,903, entitled "Solid State Imaging Device." Unfortunately, the additional well contacts within the pixel array consume limited area that can otherwise be used for the photodiodes, and thus adversely impact the performance of the image sensor. Contacts within the pixel array also adversely effects pixel dark current as documented by U.S. Pat. No. 7,456,880, entitled "Photoelectric Conversion Element Having a Plurality of Semiconductor Regions and Including Conductive Layers Provided on Each Isolation Element Region."

A further technique involves reducing the clock speed for certain signals associated with sampling and readout of the pixels. See, for example, U.S. Pat. No. 7,468,750, entitled "Solid-State Imaging Device Having Transition Time Relationship for Drive Signals." However, slower clocking means it will take longer to read out the pixel data associated with a given image.

SUMMARY

An image sensor includes a pixel array having photoactive pixels and dark reference pixels. The photoactive pixels are configured in a sub-array within the pixel array. Well contacts are placed only along opposing sides or edges of the sub-array of photoactive pixels. In one embodiment in accordance with the invention, the photoactive pixels and dark reference pixels are arranged in rows and columns and the well contacts are only disposed along the top and bottom sides or edges of the sub-array or pixel array. In another embodiment in accordance with the invention, the photoactive pixels and dark reference pixels are arranged in rows and columns and the well contacts are only disposed along the left side and right side of the sub-array or pixel array.

Pattern noise in a line of pixels in a pixel array of an image sensor can be compensated for by reading out of the pixel array the image signals from the photoactive pixels and dark signals from the dark reference pixels. The image and dark reference signals can optionally be stored in a memory. An averaged dark signal value is determined by averaging the dark signals from the dark reference pixels in one line of pixels. The line of pixels can be, for example, a row of pixels or a column of pixels in the pixel array. The averaged dark signal value is then subtracted from the image signals in the same line of pixels.

BRIEF DESCRIPTION OF THE DRAWINGS

The above and other objects, features, and advantages of the present invention will become more apparent when taken in conjunction with the following description and drawings. The elements of the drawings are not necessarily to scale relative to each other.

DETAILED DESCRIPTION

Figure 1:
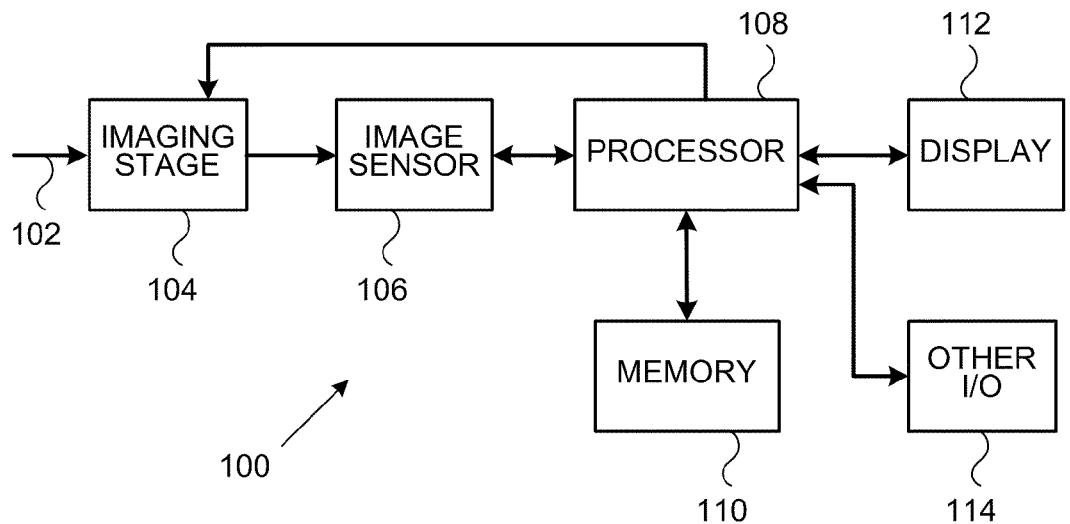
FIG. 1 is a block diagram of an image capture device in an embodiment in accordance with the invention.

The present invention will be illustrated herein in conjunction with particular embodiments of image capture devices, image sensors, and associated sampling and readout techniques. It should be understood, however, that these illustrative arrangements are presented by way of example only, and should not be viewed as limiting the scope of the invention in any way. Those skilled in the art will recognize that the disclosed arrangements can be adapted in a straightforward manner for use with a wide variety of other types of imaging devices, image sensors, and associated sampling and readout techniques.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" or "circuitry" means either a single component or a multiplicity of components, either active or passive, that are connected together to provide a desired function. The term "signal" means at least one current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the terms "wafer" and "substrate" are to be understood as a semiconductor-based material including, but not limited to, silicon, silicon-on-insulator (SOI) technology, silicon-on-sapphire (SOS) technology, doped and undoped semiconductors, epitaxial layers formed on a semiconductor substrate, and other semiconductor structures.

Referring to the drawings, like numbers indicate like parts throughout the views.

FIG. 1 is a block diagram of an image capture device in an embodiment in accordance with the invention. Image capture device 100 is implemented as a digital camera in FIG. 1. Those skilled in the art will recognize that a digital camera is only one example of an image capture device that can utilize an image sensor incorporating the present invention. Other types of image capture devices, such as, for example, cell phone cameras, scanners, and digital video camcorders, can be used with the present invention.

In the digital camera 100, light 102 from a subject scene is input to an imaging stage 104. Imaging stage 104 may comprise conventional elements such as a lens, a neutral density filter, an iris and a shutter. The light is focused by imaging stage 104 to form an image on an image sensor 106, which converts the incident light to electrical signals. Digital camera 100 further includes a processor 108, memory 110, display 112, and one or more additional input/output (I/O) elements 114.

Figure 2:
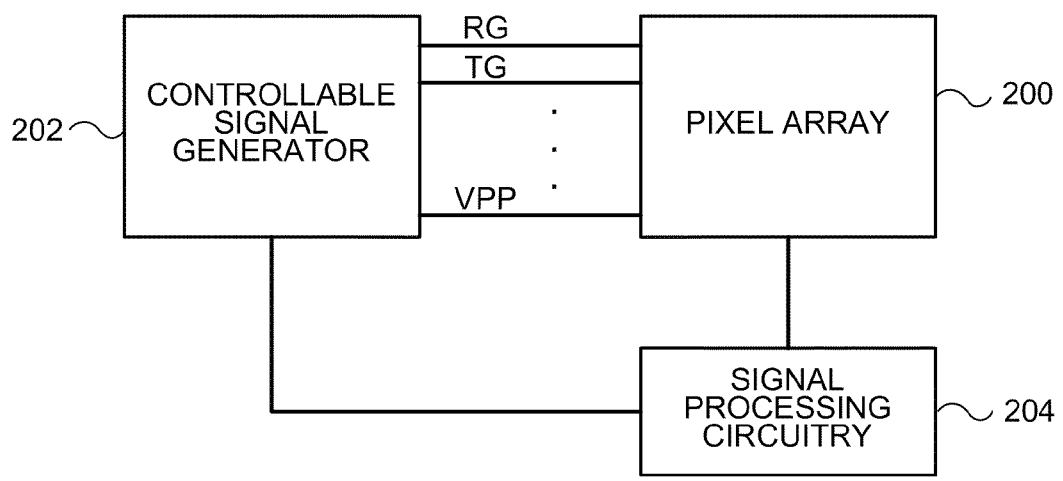
FIG. 2 is a simplified block diagram of the image sensor of FIG. 1.

Image sensor 106 is assumed in the present embodiment to be a CMOS image sensor, although other types of image sensors may be used in implementing the invention. As shown in FIG. 2, image sensor 106 more particularly comprises a pixel array 200, a controllable signal generator 202 and signal processing circuitry 204. In other embodiments, one or both of elements 202 and 204 may be arranged external to the image sensor.

Pixel array 200 generally comprises a plurality of pixels arranged in an array. The pixels are arranged in rows and columns in an embodiment in accordance with the invention. Other embodiments in accordance with the invention can arrange the pixels differently. By way of example only, a pixel array can be arranged as disclosed in United States Patent Application Publication 2009/0230287.

Figure 11:
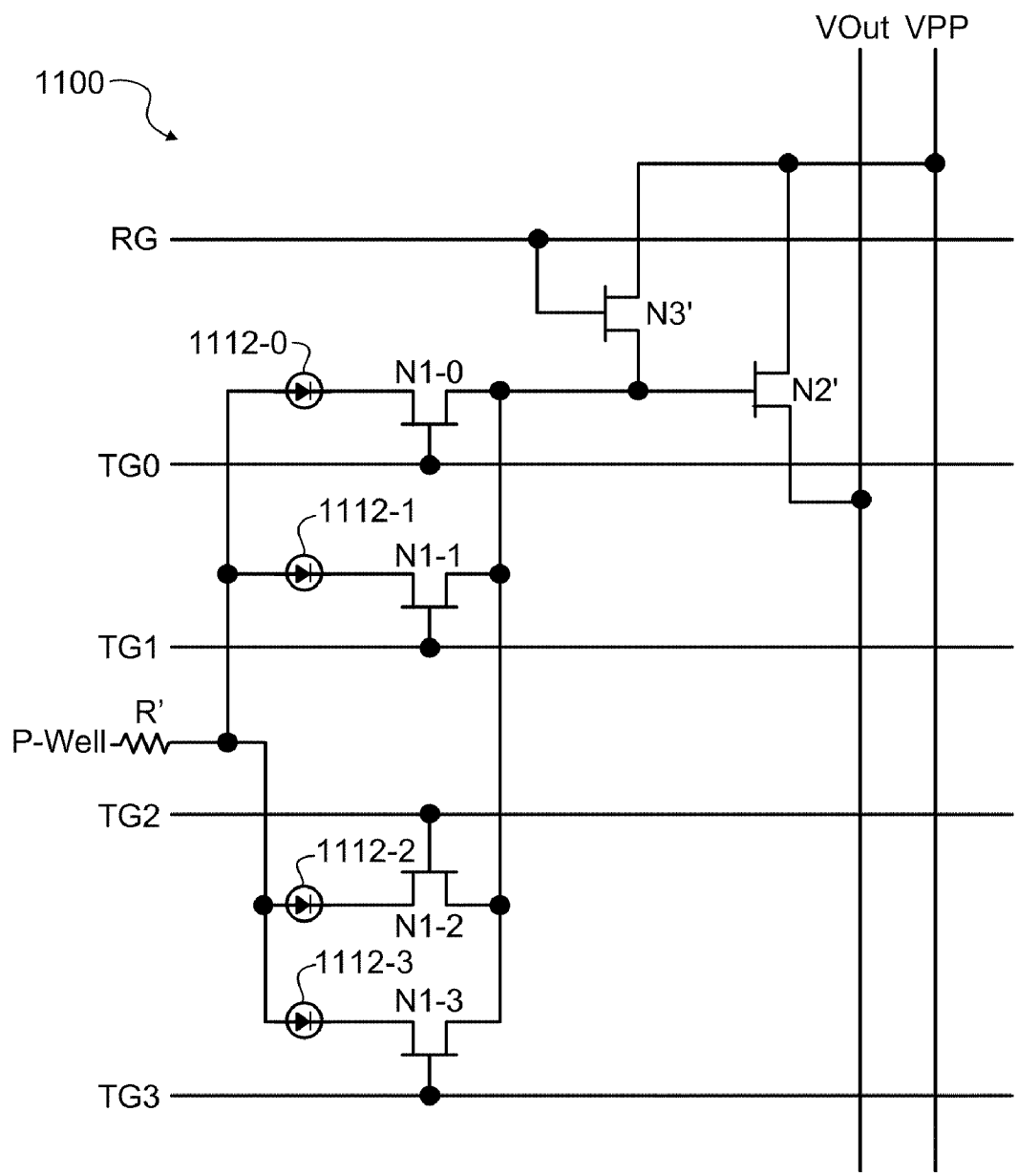
FIG. 11 is a schematic diagram of a portion of a pixel array illustrating one example of NMOS pixel circuitry in which multiple pixels share an output transistor and a reset transistor.

Pixel array 200 may also incorporate at least a portion of the sampling and readout circuitry of the digital camera 100, as will be described below in conjunction with FIGS. 3, 4, and 11. For example, at least a portion of the sampling and readout circuitry may be formed integrally with the pixel array, for example, on a common integrated circuit with photodiodes and other elements of the pixel array.

Elements 202 and 204 may also be viewed as part of the sampling and readout circuitry of the digital camera 100, and one or both of such elements may be formed integrally with the pixel array 200. Portions of the sampling and readout circuitry of the digital camera 100 may also or alternatively be implemented in processor 108 (FIG. 1). Accordingly, the term "sampling and readout circuitry" as used herein is intended to be broadly construed so as to encompass any circuitry associated with the sampling and readout functionality of the digital camera 100, and portions of such circuitry may be arranged within image sensor 106 or elsewhere in the camera. As will become apparent, a given readout process as described herein will typically incorporate sampling operations, and thus the circuitry that implements such a process is referred to as "sampling and readout circuitry." This term should not be construed as requiring separate sampling and readout processes, or separate sampling circuitry and readout circuitry.

Image sensor 106 will typically be implemented as a color image sensor having an associated Color Filter Array (CFA) pattern. Examples of CFA patterns that may be used with the image sensor 14 include those described in the above-cited United States Patent Application Publication 2007/0024931, although other CFA patterns may be used in other embodiments of the invention.

The controllable signal generator 202 may operate under control of the processor 108 to generate signals associated with sampling and readout of the pixel array 200, including, by way of example, reset gate (RG), transfer gate (TG) and pixel power (VPP) signals. Other types of signals used to select particular rows and columns of the pixel array 200 for processing may be generated by the signal generator 202.

Signal processing circuitry 204 may comprise, for example, an analog signal processor for processing analog signals read out from pixel array 200 and an analog-to-digital converter for converting such signals to a digital form suitable for processing by processor 108.

Processor 108 may comprise, for example, a microprocessor, a central processing unit (CPU), an application-specific integrated circuit (ASIC), a digital signal processor (DSP), or other processing device, or combinations of multiple such devices. Various elements of imaging stage 104 and image sensor 106 may be controlled by timing signals or other signals supplied from processor 108.

Memory 110 may comprise any type of memory, such as, for example, random access memory (RAM), read-only memory (ROM), Flash memory, disk-based memory, or other types of storage elements, in any combination. Sampling and readout techniques as described herein may be implemented at least in part in the form of software that is stored in memory 110 and executed by processor 108.

A given image captured by image sensor 106 may be stored by processor 108 in memory 110 and presented on display 112. Display 112 is typically an active matrix color liquid crystal display (LCD), although other types of displays may be used. The additional I/O elements 114 may comprise, for example, various on-screen controls, buttons or other user interfaces, network interfaces, and memory card interfaces.

Additional details regarding the operation of a digital camera of the type shown in FIG. 1 can be found, for example, in the above-cited United States Patent Application Publication 2007/0024931.

It is to be appreciated that the digital camera as shown in FIG. 1 may comprise additional or alternative elements of a type known to those skilled in the art. Elements not specifically shown or described herein may be selected from those known in the art. As noted previously, the present invention may be implemented in a wide variety of other types of digital cameras or image capture devices. Also, as mentioned above, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Image sensor 106 as shown in FIG. 2 may be fabricated on a silicon substrate or other type of substrate. In a typical CMOS image sensor, each pixel of the pixel array includes a photodetector and associated circuitry for measuring the light level at that pixel.

Figure 3:
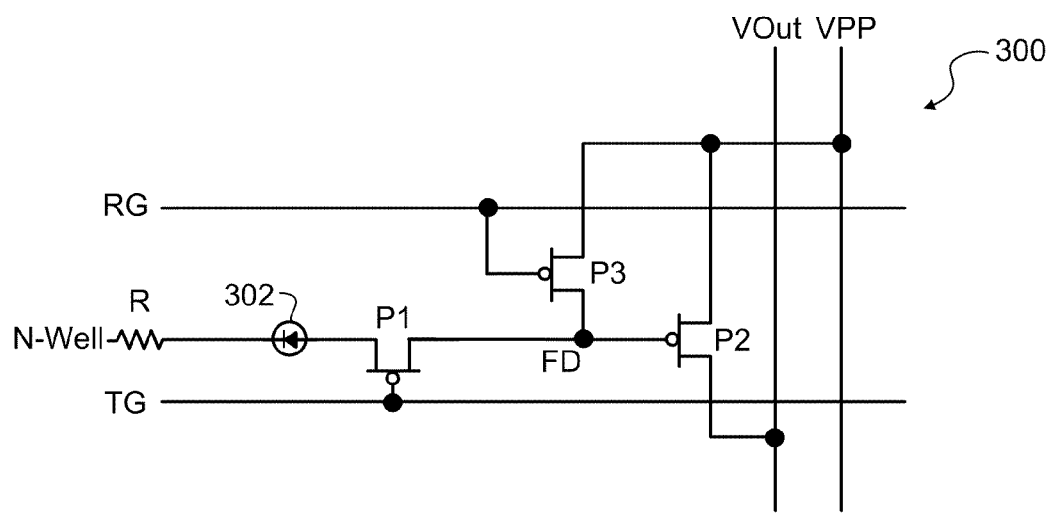
FIG. 3 is a schematic diagram of exemplary PMOS pixel circuitry suitable for use in image sensor 106 shown in FIG. 2.

Referring now to FIG. 3, there is shown a schematic diagram of exemplary PMOS pixel circuitry suitable for use in image sensor 106 shown in FIGS. 1 and 2. Pixel 300 comprises a photodetector 302 and three associated PMOS transistors P1, P2 and P3. Photodetector 302 is implemented as a photodiode or pinned photodiode in an embodiment in accordance with the invention. In the FIG. 3 embodiment, photodetector 302 and PMOS transistors P1, P2 and P3 are formed in an n-well on a p-type substrate of image sensor 106 (FIG. 1).

The first transistor P1 transfers collected charge from photodetector 302 to a charge-to-voltage conversion region in response to a transfer gate (TG) signal. The charge-to-voltage conversion region is implemented as a floating diffusion (FD) in an embodiment in accordance with the invention. The transistor P1 itself is also commonly referred to as a transfer gate.

The second transistor P2 is an output transistor configured to amplify the signal on the floating diffusion and to supply the amplified signal to an output voltage column line VOut. The third transistor P3 resets the floating diffusion by coupling it to a power supply voltage VPP in response to a reset gate (RG) signal.

It should be noted that each pixel need not include its own reset transistor and output transistor as in the FIG. 3 arrangement. Typically, a given reset transistor and a given output transistor are shared among multiple pixels. An example of such a sharing arrangement will be described below in conjunction with FIG. 11. Accordingly, the term "pixel" as used herein is intended to encompass, for example, a grouping of circuitry elements such as 302, P1, P2 and P3, or an alternative grouping comprising just 302 and P1 in an embodiment where pixel 300 shares P2 and P3 with other pixels. Numerous alternative arrangements of pixel circuitry may be used in these and other embodiments of the invention.

The element R in FIG. 3 denotes the resistance of the n-well between the pixel 300 and the nearest n-well contact (not shown). As noted previously herein, prior art image sensors typically introduced the well bias voltage through well contacts in a ring around the periphery of the pixel array. These well contacts are close to edge pixels of the array but far from central pixels of the array, and thus the value of R for a pixel near the center of the array can be very large, leading to well bounce issues that are addressed in a manner to be described in greater detail below.

At least a portion of the pixel circuitry of FIG. 3 may be repeated for each of the other pixels of the array 200 (FIG. 2). Pixels in the same row of the array share a common RG signal, while pixels in the same column of the array share the output voltage column line VOut. As indicated previously, the output transistor P2 and reset transistor P3 of the pixel circuitry may be shared between multiple pixels.

Figure 4:
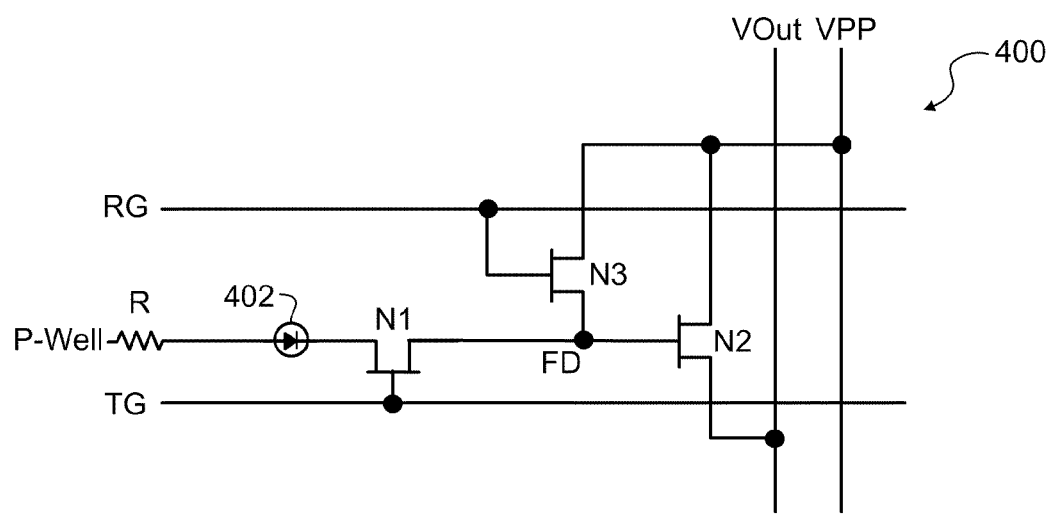
FIG. 4 is a schematic diagram of exemplary NMOS pixel circuitry suitable for use in image sensor 106 shown in FIG. 2.

FIG. 4 is a schematic diagram of exemplary NMOS pixel circuitry suitable for use in image sensor 106 shown in FIGS. 1 and 2. In this embodiment, NMOS pixel 400 comprises photodetector 402 and NMOS transistors N1, N2 and N3. Photodetector 402 is implemented as a photodiode or pinned photodiode in an embodiment in accordance with the invention. In the FIG. 4 embodiment, photodetector 402 and NMOS transistors N1, N2 and N3 are formed in a p-well on an n-type substrate of the image sensor 106 (FIG. 1). The operation of NMOS pixel 400 is analogous to that described previously for PMOS pixel 300 shown in FIG. 3.

Figure 5:
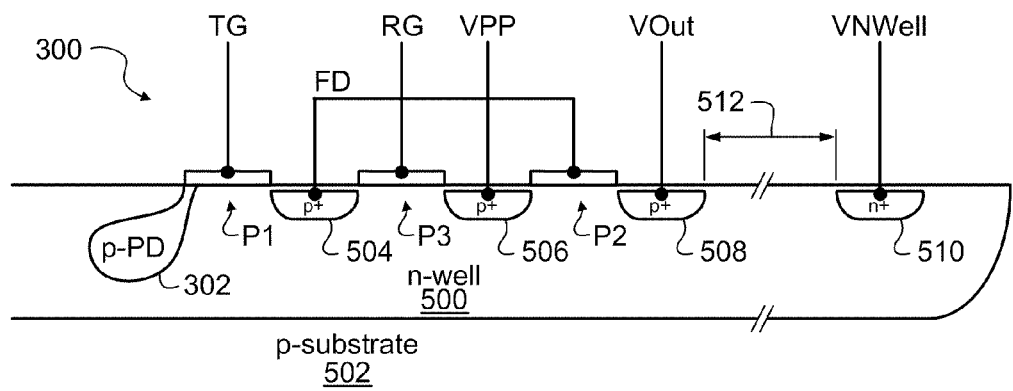
FIG. 5 is a cross-sectional view of a portion of an image sensor comprising the PMOS pixel circuitry shown in FIG. 3.

Referring now to FIG. 5, there is shown a cross-sectional view of a portion of an image sensor comprising the PMOS pixel circuitry shown in FIG. 3. Photodetector 302 and the three PMOS transistors P1, P2, and P3 are formed in n-well 500 on a p-type substrate 502. The transistors P1, P2 and P3 are formed utilizing p+ diffusion regions 504, 506 and 508. VNwell denotes a bias voltage applied to n-well 500 via an n+contact 510. As mentioned above, there may be a large distance between the bias voltage contact and the circuitry of the pixel 300, as illustrated by arrow 512 in FIG. 5. This large resistance, represented by R in FIG. 3, can make the n-well voltage unstable, leading to the well bounce problem previously described.

It was noted above that a given pixel may share a reset transistor and an output transistor with one or more other pixels of the pixel array. FIG. 11 shows a version of the NMOS pixel circuitry configured with sharing of an output transistor N2' and a reset transistor N3' by a group of four pixels. The four pixels include respective photodetectors 1112-0, 1112-1, 1112-2 and 1112-3 coupled to respective transfer gates N1-0, N1-1, N1-2 and N1-3 as shown. The resistance R' in this embodiment represents the resistance of the p-well in which the photodetectors and the NMOS transistors are formed. An analogous set of PMOS circuitry may be formed in a complementary manner. Of course, numerous alternative arrangements for sharing of output transistors, reset transistors, floating diffusions or other types of pixel circuitry among multiple pixels may be used. For example, more or fewer than four pixels may be part of a given group configured to share pixel circuitry.

Figure 6:
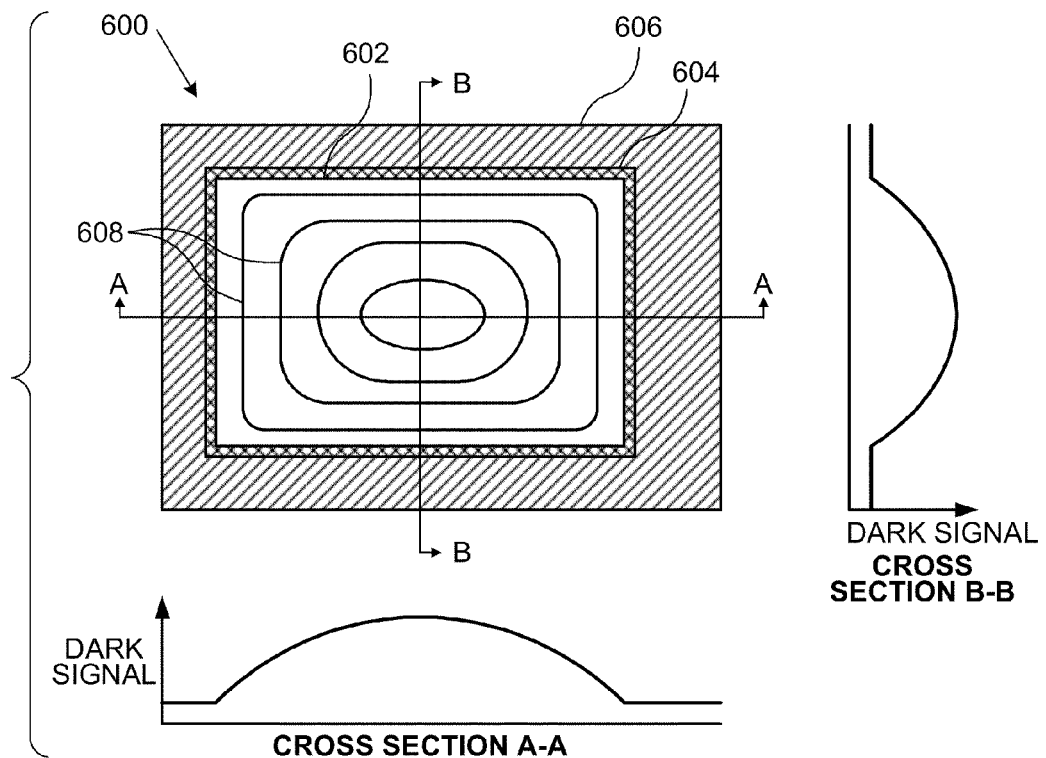
FIG. 6 illustrates a pixel array and a ring of well contacts according to the prior art.

Well bounce in image sensors incorporating pixels of the type described above may have a problem with the pixel signal level when the image sensor is not exposed to light and is in the dark (zero light illumination). Ideally, all pixel signal levels should be equal under no illumination. But due to the well bounce problem, there is an intensity gradient to the dark signal level. FIG. 6 illustrates an array of pixels and a ring of well contacts according to the prior art. A pixel array 600 includes a sub-array of photoactive pixels 602 surrounded by a ring of well contacts 604. The photoactive pixels 602 are exposed to light when pixel array 600 is exposed to light.

Dark reference pixels 606 are positioned outside of the ring of well contacts 604. Dark reference pixels 606 are pixels covered by an opaque material (not shown) so that the dark reference pixels are not exposed to light when pixel array 600 is exposed to light. Dark reference pixels 606 are used to correct row and column fixed pattern noise. The intensity gradient caused by the well bounce problem is shown as contour lines 608. The dark signal is not flat or uniform throughout pixel array 600, as shown by the cross-sectional views along lines A-A and B-B in FIG. 6.

Figure 7:
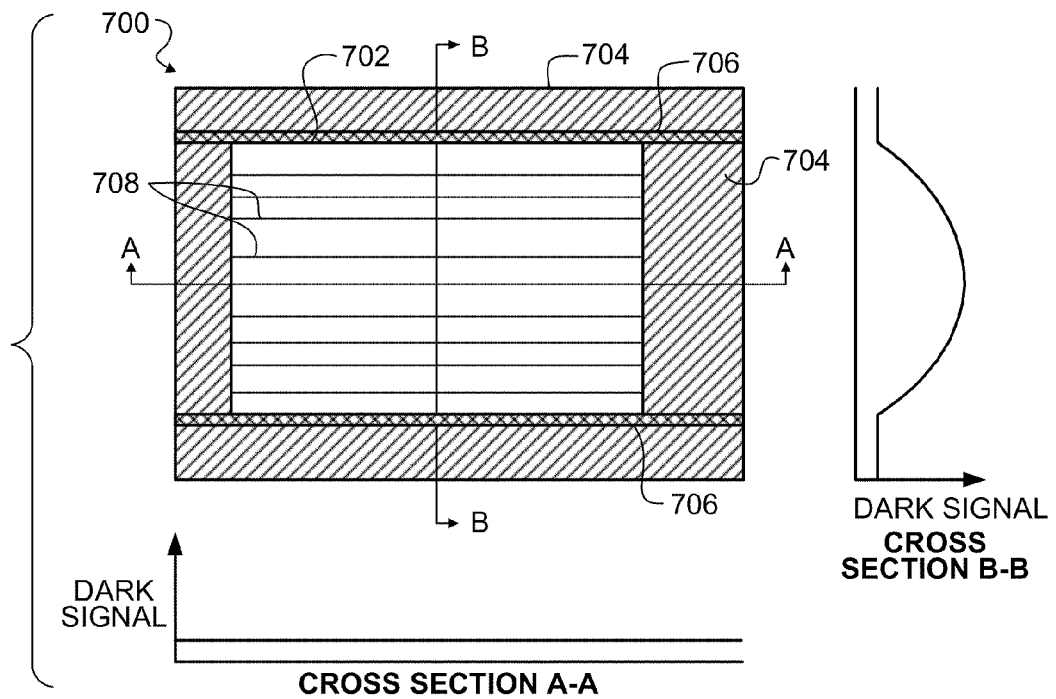
FIG. 7 depicts a first pixel array in an embodiment in accordance with the invention.

Referring now to FIG. 7, there is shown a first pixel array in an embodiment in accordance with the invention. Pixel array 700 includes a sub-array of photoactive pixels 702 and dark reference pixels 704. Both sub-array of photoactive pixels 702 and dark reference pixels 704 include multiple rows and columns of pixels in an embodiment in accordance with the invention.

Well contacts 706 are placed only along opposing sides or edges of the sub-array of photoactive pixels 702. In the FIG. 7 embodiment, well contacts 706 are disposed along the top and bottom edges of the sub-array of photoactive pixels 702. Well contacts 706 are not included on the remaining sides of the array or within the array in an embodiment in accordance with the invention.

Where the prior art focused on keeping the well voltage stable, embodiments in accordance with the invention allow the well voltage to bounce on the sides or edges of sub-array of photoactive pixels 702 that do not have well contacts 706. So in the FIG. 7 embodiment, a non-uniform well voltage bounce is produced in the column direction of pixel array 700. When well contacts 706 are placed along the top and bottom sides of the sub-array of photoactive pixels 702, a uniform row well bounce is produced along the rows in pixel array 700, as illustrated in the cross-sectional view along line A-A. The intensity gradient caused by the uniform row well bounce is shown as contour lines 708. A non-uniform well bounce is still present along the column direction of pixel array 700, as shown in the cross-sectional view along line B-B.

Well contacts 706 are placed between the sub-array of photoactive pixels 702 and dark reference pixels 704 in the FIG. 7 embodiment. Other embodiments in accordance with the invention are not limited to this configuration. Well contacts can be placed at the top and bottom edges of dark reference pixels 704 in another embodiment in accordance with the invention.

Figure 8:
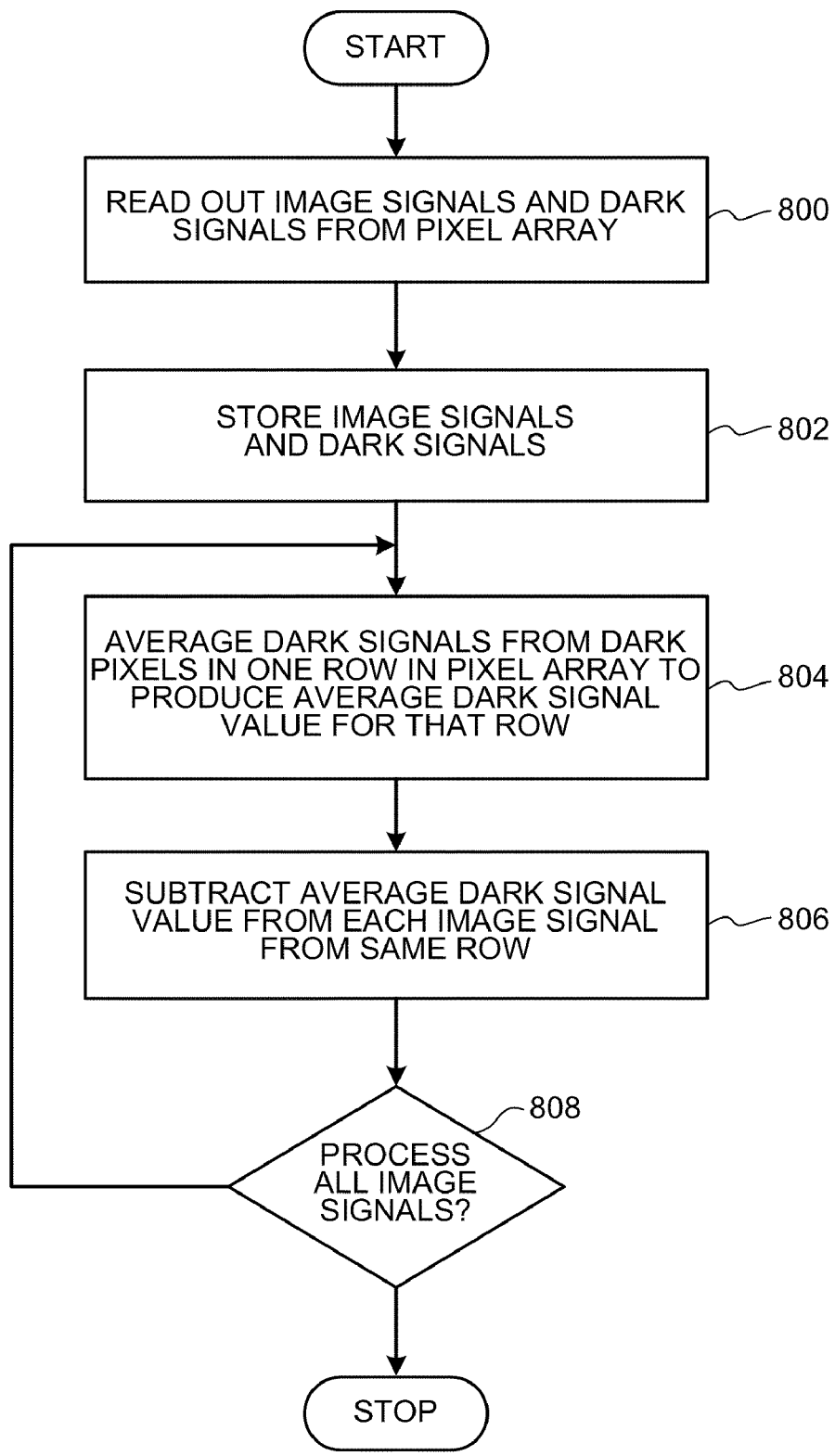
FIG. 8 is a flowchart of a method for compensating for row pattern noise in an embodiment in accordance with the invention.

FIG. 8 is a flowchart of a method for compensating for row pattern noise in an embodiment in accordance with the invention. Initially, the image signals and dark signals are read out of the pixel array (block 800). The image and dark signals are then stored in memory, as shown in block 802. Storing the image and dark signal values in memory is optional, and other embodiments in accordance with the invention do not have to store the image and dark signals in memory.

An average dark signal value is then determined for one line of dark reference pixels in the pixel array by averaging the dark signals from the dark reference pixels in that line (block 804). In the FIG. 8 embodiment, the line of pixels corresponds to a row of pixels in the pixel array. The average dark signal value is subtracted from the image signals from the photoactive pixels in the same row (block 806). Subtracting the average dark signal value from the image signals removes the non-uniform dark signal produced by the well bounce.

A determination is then made at block 808 as to whether all of the image signals have been processed. If not, the method returns to block 804 and repeats until all of the image signals are processed.

By way of example only, the image and dark signals can be stored in memory 110 and the determination of the average dark signal value and the subtraction of the average dark signal value from the image signals can be performed by processor 108 shown in FIG. 1. Embodiments of image sensors that integrate a memory, a processor, or both on the image sensor can use the integrated elements for these functions.

Figure 9:
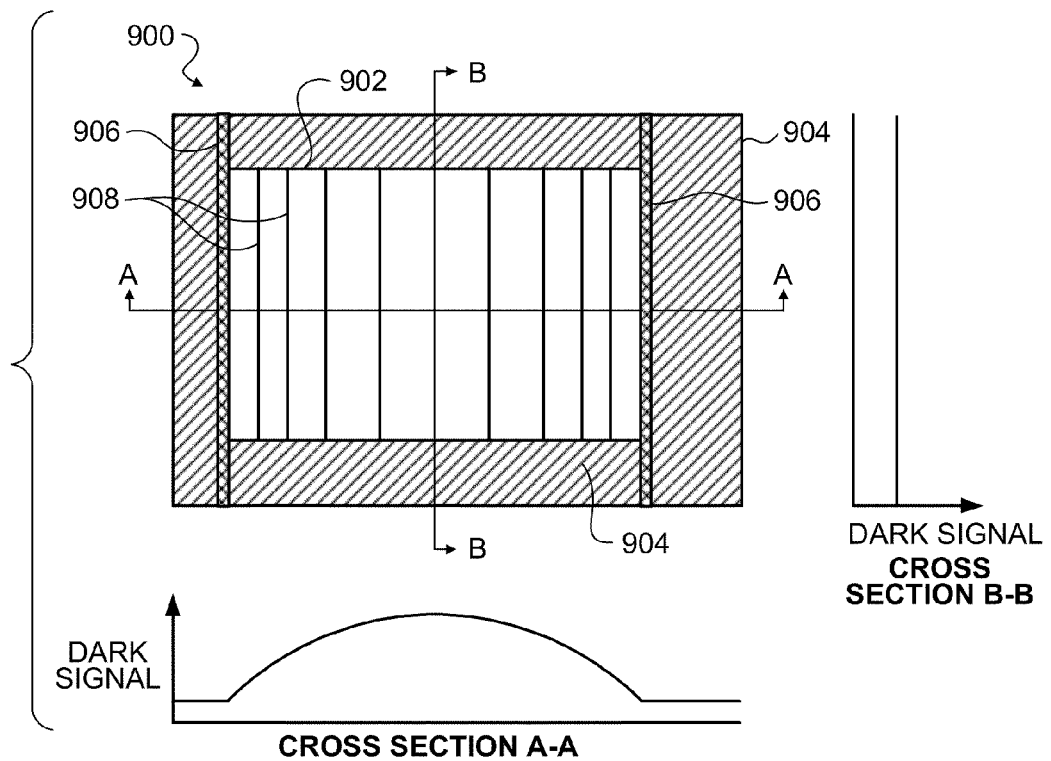
FIG. 9 illustrates a second pixel array in an embodiment in accordance with the invention.

Referring now to FIG. 9, there is shown a second pixel array in an embodiment in accordance with the invention. Pixel array 900 includes a sub-array of photoactive pixels 902 and dark reference pixels 904. Both sub-array of photoactive pixels 902 and dark reference pixels 904 include multiple rows and columns of pixels in an embodiment in accordance with the invention. Well contacts 906 are disposed along the left and right sides or edges of the sub-array of photoactive pixels 902.

In the FIG. 9 embodiment, a uniform column well bounce is produced along the columns in pixel array 900, as illustrated in the cross-sectional view along line B-B. The intensity gradient caused by the uniform column well bounce is shown as contour lines 908. A non-uniform well bounce is still present along the rows of pixel array 900, as shown in the cross-sectional view along line A-A.

Figure 10:
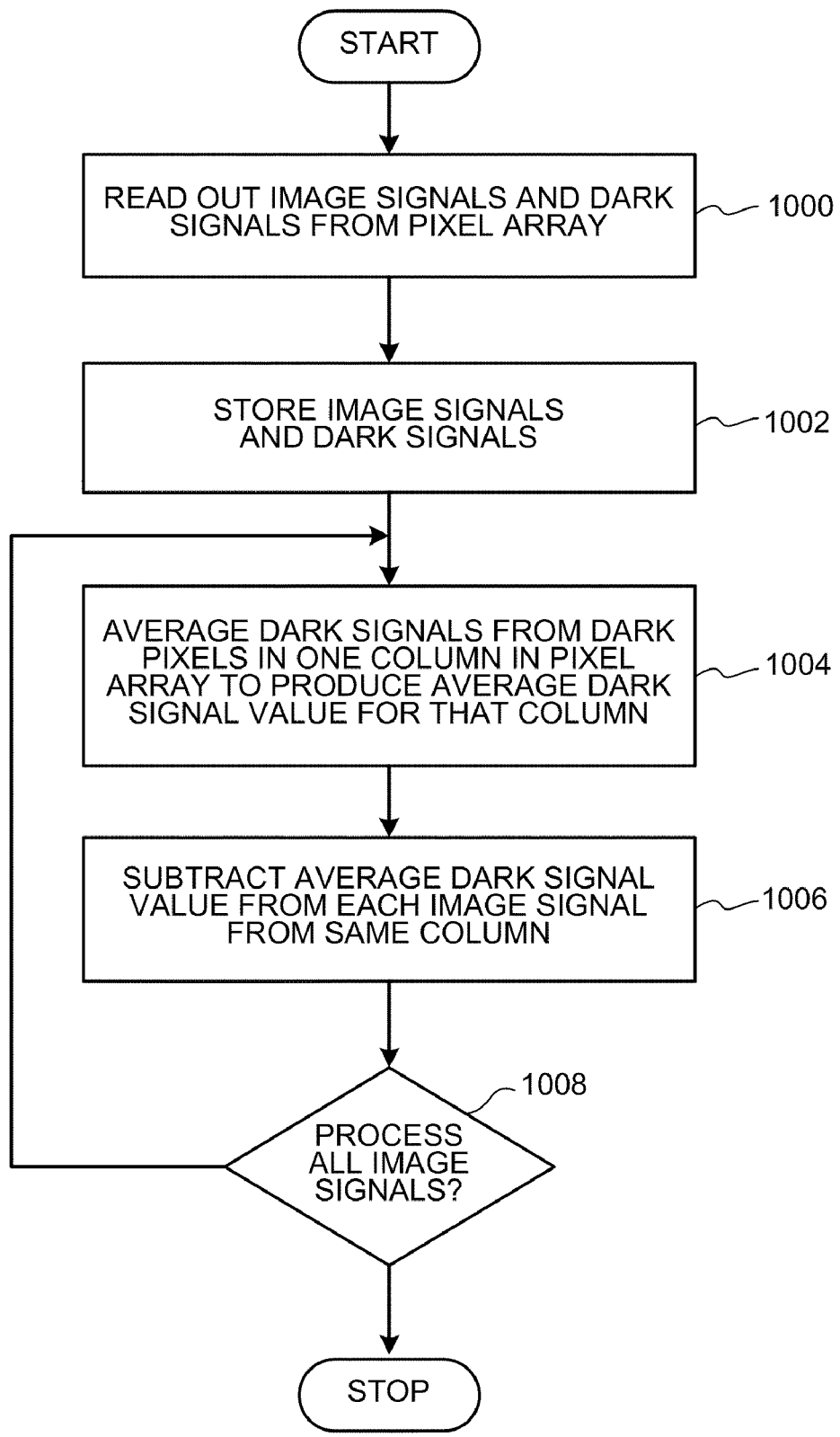
FIG. 10 is a flowchart of a method for compensating for column pattern noise in an embodiment in accordance with the invention.

FIG. 10 is a flowchart of a method for compensating for column pattern noise in an embodiment in accordance with the invention. Initially, the image signals and dark signals are read out of the pixel array (block 1000). The image and dark signals are then stored in memory, as shown in block 1002.

An average dark signal value is then determined for one line of dark reference pixels in the pixel array by averaging the dark signals from the dark reference pixels in that line (block 1004). In the FIG. 10 embodiment, the line of pixels corresponds to a column of pixels in the pixel array. The average dark signal value is subtracted from the image signals from the photoactive pixels in the same column (block 1006). Subtracting the average dark signal value from the image signals removes the non-uniform dark signal produced by the well bounce.

A determination is then made at block 1008 as to whether all of the image signals have been processed. If not, the method returns to block 1004 and repeats until all of the image signals are processed.

The above-described illustrative embodiments advantageously reduce well bounce in an image sensor comprising PMOS or NMOS pixels. In other embodiments, different types of pixel circuitry may be used, as well as different types of signal timing and charge balancing arrangements.

The image sensor 106 (FIG. 1) may include additional sampling and readout circuitry, such as, for example, otherwise conventional column circuitry and row circuitry commonly utilized in sampling and readout of pixel array. Such additional circuitry, being well understood by those skilled in the art, is not described in detail herein.

The invention has been described in detail with particular reference to certain illustrative embodiments thereof, but it will be understood that variations and modifications can be effected within the scope of the invention as set forth in the appended claims. For example, other types of image sensors and digital imaging devices may be used, using alternative pixel array configurations and other types of sampling and readout circuitry and processes. Also, the particular assumptions made in conjunction with the illustrative embodiments need not apply in alternative embodiments. These and other alternative embodiments will be readily apparent to those skilled in the art.

Additionally, even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST 100 image capture device
102 light
104 imaging stage
106 image sensor
108 processor
110 memory
112 display
114 other input/output (I/O) elements
200 pixel array
202 controllable signal generator
204 signal processing circuitry
300 PMOS pixel
302 photodetector
400 NMOS pixel
402 photodetector
500 n-type well
502 p-type substrate
504 p+ diffusion region
506 p+ diffusion region
508 p+ diffusion region
510 n+ contact
512 arrow illustrating distance between bias voltage contact and circuitry
600 pixel array
602 sub-array of photoactive pixels
604 well contacts
606 dark reference pixels
608 contour lines illustrating well bounce
700 pixel array
702 sub-array of photoactive pixels
704 dark reference pixels
706 well contacts
708 contour lines illustrating uniform row well bounce
900 pixel array
902 sub-array of photoactive pixels
904 dark reference pixels
906 well contacts
908 contour lines illustrating uniform column well bounce
1100 NMOS pixel circuitry
1112 photodetectors P1 PMOS transfer transistor
P2 PMOS output transistor
P3 PMOS reset transistor
N1 NMOS transfer transistor
N2 NMOS output transistor
N3 NMOS reset transistor
N2' shared output transistor
N3' shared reset transistor
R well resistance
R' well resistance

The invention claimed is:

1. An image sensor comprising:
a substrate of a first conductivity type;
a plurality of pixels formed in a well of a second conductivity type opposite the first conductivity type, wherein the plurality of pixels are arranged in an array; and
a plurality of well contacts for providing a bias voltage to the well of the second conductivity type, wherein the plurality of well contacts are only disposed on two opposing sides of the array with no well contacts disposed on the remaining sides of the array or within the array.

2. The image sensor of claim 1, wherein the plurality of pixels includes photoactive pixels and dark reference pixels.

3. The image sensor of claim 1, wherein the plurality of well contacts are only disposed along an upper side and a lower side of the array.

4. The image sensor of claim 1, wherein the plurality of well contacts are only disposed along a right side and a left side of the array.

5. An image capture device comprising:
An image sensor including:
a substrate of a first conductivity type;
a plurality of pixels formed in a well of a second conductivity type opposite the first conductivity type, wherein the plurality of pixels are arranged in an array; and
a plurality of well contacts for providing a bias voltage to the well of the second conductivity type, wherein the plurality of well contacts are only disposed on two opposing sides of the array with no well contacts disposed on the remaining sides of the array or within the array.

6. The image capture device of claim 5, wherein the plurality of pixels includes photoactive pixels and dark reference pixels.

7. The image capture device of claim 5, wherein the plurality of well contacts are only disposed along an upper side and a lower side of the array.

8. The image capture device of claim 5, wherein the plurality of well contacts are only disposed along a right side and a left side of the array.

* * * * *